(12) United States Patent
Matsudai et al.

(10) Patent No.: US 10,985,268 B2
(45) Date of Patent: Apr. 20, 2021

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tomoko Matsudai, Tokyo (JP); Yoko Iwakaji, Tokyo (JP)

(73) Assignees: KABUSH1 KI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/558,237

(22) Filed: Sep. 2, 2019

(65) Prior Publication Data

US 2020/0303524 A1 Sep. 24, 2020

(30) Foreign Application Priority Data

Mar. 18, 2019 (JP) ............................. JP2019-050052

(51) Int. Cl.
*H01L 29/739* (2006.01)
*H01L 29/08* (2006.01)

(52) U.S. Cl.
CPC ........ *H01L 29/7397* (2013.01); *H01L 29/083* (2013.01)

(58) Field of Classification Search
CPC ..................... H01L 29/7397; H01L 29/083
See application file for complete search history.

(56) References Cited

U.S. PATENT DOCUMENTS

| 4,821,083 | A | 4/1989 | Ogura et al. |
| 4,980,743 | A | 12/1990 | Nakagawa et al. |
| 8,421,184 | B2 | 4/2013 | Koyama et al. |
| 10,186,608 | B2 * | 1/2019 | Naito .................. H01L 29/4236 |
| 2003/0141542 | A1 * | 7/2003 | Ishimura ............. H01L 29/7397 |
| | | | 257/330 |
| 2010/0123187 | A1 * | 5/2010 | Burke ............... H01L 29/66727 |
| | | | 257/330 |
| 2014/0209972 | A1 | 7/2014 | Sumitomo et al. |
| 2017/0301779 | A1 * | 10/2017 | Naito .................. H01L 29/0834 |

(Continued)

FOREIGN PATENT DOCUMENTS

| JP | H01-270352 A | 10/1989 |
| JP | 5251102 B2 | 7/2013 |

*Primary Examiner* — Christine A Enad
(74) *Attorney, Agent, or Firm* — Kim & Stewart LLP

(57) ABSTRACT

A semiconductor device includes a semiconductor substrate including first and second surfaces, and a first semiconductor layer of a first conductivity type, a first electrode on the first surface, a first control electrode that is inwardly from the first surface and electrically insulated from the semiconductor substrate and the first electrode, a second control electrode that is inwardly from the first surface, electrically insulated from the semiconductor substrate and the first electrode via a fourth insulating film, and biased independently from the first control electrode, a third control electrode on the second surface and electrically insulated from the semiconductor substrate, and a second electrode on the second surface and electrically connected to the semiconductor substrate.

12 Claims, 6 Drawing Sheets

(56) References Cited

U.S. PATENT DOCUMENTS

| | | |
|---|---|---|
| 2019/0006495 A1 | 1/2019 | Ogura et al. |
| 2019/0296133 A1 | 9/2019 | Iwakaji et al. |
| 2020/0091325 A1 | 3/2020 | Matsudai et al. |
| 2020/0098903 A1* | 3/2020 | Satoh .................. H01L 29/7397 |
| 2020/0273971 A1* | 8/2020 | Ishikawa ............. H01L 29/4236 |

* cited by examiner

SEMICONDUCTOR DEVICE

CROSS-REFERENCE TO RELATED APPLICATION(S)

This application is based upon and claims the benefit of priority from Japanese Patent Application No. 2019-050052, filed Mar. 18, 2019, the entire contents of which are incorporated herein by reference.

FIELD

Embodiments described herein relate generally to a semiconductor device.

BACKGROUND

An insulated gate type bipolar transistor (hereinafter, Insulated Gate Bipolar Transistor: IGBT), for example, is used as a semiconductor device to control large currents with high breakdown voltages of 600 V or more. The IGBT is used, for example, for power conversion. A low, constant on-resistance and a low switching loss, which provides high switching speed are both desired to increase conversion efficiency.

In recent years, an increasing number of IGBTs have a trench gate structure extending deeply from a p-type base layer into an n-type base layer in order to reduce the on-resistance. Accordingly, carriers can be efficiently accumulated in the n-type base layer by increasing channel density and by utilizing a shape of an adjacent trench gate in the n-type base layer, which reduces the continuous on-resistance. However, when carrier concentration is increased to achieve the low on-resistance, the number of carriers that need to be discharged at turn-on time increases. Therefore, the turn-off time period becomes prolonged, and loss during the turn-off time increases. That is, improvements in reducing on-resistance are traded off with reduction in the turn-off loss.

DETAILED DESCRIPTION

Figure 1:
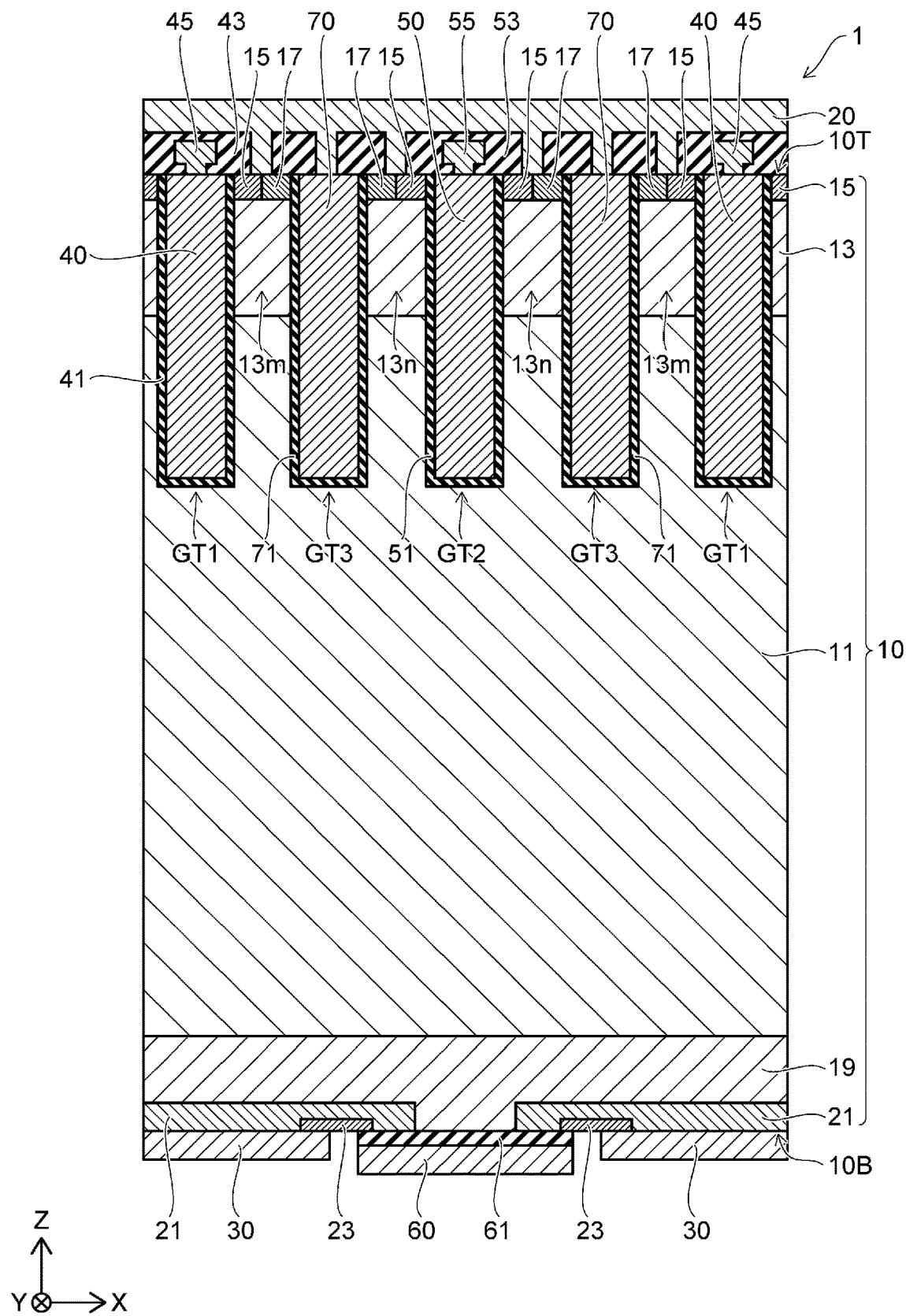
FIG. 1 is a schematic cross-sectional view of a semiconductor device according to a first embodiment.

Embodiments provide a semiconductor device having reduced on-resistance and switching loss.

In general, according to one embodiment, a semiconductor device includes a semiconductor substrate including a first semiconductor layer of a first conductivity type, and having a first surface and a second surface on an opposite side of the first surface, a first electrode on the first surface, a first control electrode which is provided inwardly from the first surface of the semiconductor substrate, and electrically insulated from the semiconductor substrate via a first insulating film and electrically insulated from the first electrode via a second insulating film, a second control electrode which is provided inwardly from the first surface of the semiconductor substrate, and electrically insulated from the semiconductor substrate via a third insulating film, electrically insulated from the first electrode via a fourth insulating film, and biased independently from the first control electrode, a third control electrode on a first portion of the second surface and electrically insulated from the semiconductor substrate via a fifth insulating film, and a second electrode on a second portion of the second surface and electrically connected to the semiconductor substrate. The semiconductor substrate includes a second semiconductor layer of a second conductivity type between the first semiconductor layer and the first electrode, a third semiconductor layer of the first conductivity type between the second semiconductor layer and the first electrode, a fourth semiconductor layer of the first conductivity type between the first semiconductor layer and the second electrode and between the first semiconductor layer and the third control electrode, and having a higher concentration of a first conductivity type impurity than the first semiconductor layer, a fifth semiconductor layer of the second conductivity type between the fourth semiconductor layer and the second electrode, and a sixth semiconductor layer of the first conductivity type which is at least partially provided between the fifth semiconductor layer and the second electrode. The first control electrode faces a first portion of the second semiconductor layer via the first insulating film, and the second control electrode faces a second portion of the second semiconductor layer via the third insulating film. The third control electrode faces a portion of the fifth semiconductor layer via the fifth insulating film.

Hereinafter, embodiments will be described with reference to the drawings. A same reference numeral is given to a same part in the drawings and a detailed description thereof will be omitted as appropriate, and a different part will be described. The drawings are schematic or conceptual, and a relationship between a thickness and a width of each part, a ratio of a size between the parts, and the like are not necessarily the same as actual ones. Further, even for the same part, a dimension and a proportion may be shown differently according to the drawings.

Next, the arrangement and a configuration of each part will be described using an X axis, a Y axis, and a Z axis shown in each drawing. The X axis, the Y axis, and the Z axis are orthogonal to each other and represent an X direction, a Y direction, and a Z direction, respectively. In addition, the Z direction may be referred to as an upper side, and an opposite direction thereof may be referred to as a lower side.

First Embodiment

FIG. 1 is a schematic cross-sectional view illustrating a semiconductor device 1 according to a first embodiment. The semiconductor device 1 is, for example, an IGBT.

As shown in FIG. 1, the semiconductor device 1 includes a semiconductor substrate 10, an emitter electrode (first electrode), a collector electrode 30 (second electrode), a first gate electrode 40, a second gate electrode 50, and a third gate electrode 60.

The semiconductor substrate 10 is, for example, silicon. The semiconductor substrate 10 has a first surface 10T and a second surface 10B. The second surface 10B is a back surface of the first surface 10T. The emitter electrode 20 is provided on the first surface 10T. The collector electrode 30 is provided on the second surface 10B. The emitter electrode 20 and the collector electrode 30 include, for example, at least one material selected from the group consisting of aluminum (Al), titanium (Ti), nickel (Ni), tungsten (W), gold (Au), and polysilicon.

The first gate electrode 40 is disposed, for example, inside a trench GT1 provided on the first surface 10T side of the semiconductor substrate 10. The first gate electrode 40 extends in the Y direction inside the trench GT1. The first gate electrode 40 is electrically insulated from the semiconductor substrate 10 via a gate insulating film 41. Also, the first gate electrode 40 is electrically insulated from the emitter electrode 20 via an insulating film 43. The first gate electrode 40 includes, for example, conductive polysilicon. The gate insulating film 41 and the insulating film 43 are, for example, silicon oxide films.

The second gate electrode 50 is disposed, for example, inside the trench GT2 provided on the first surface 10T side of the semiconductor substrate 10. The second gate electrode 50 extends in the Y direction inside the trench GT2. The second gate electrode 50 is electrically insulated from the semiconductor substrate 10 via a gate insulating film 51. The second gate electrode 50 is electrically insulated from the emitter electrode 20 via the insulating film 53. The second gate electrode 50 includes, for example, conductive polysilicon. The gate insulating film 51 and the insulating film 53 are, for example, silicon oxide films.

The first gate electrode 40 and the second gate electrode 50 are electrically connected to a gate pad (not shown) via a first gate line 45 and a second gate line 55, respectively. Different gate voltages are applied to the first gate electrode 40 and the second gate electrode 50 from different gate pads, respectively. That is, the second gate electrode 50 is biased independently of the first gate electrode 40.

The third gate electrode 60 is provided on the second surface 10B side of the semiconductor substrate 10. The third gate electrode 60 is more specifically provided on the second surface 10B via a gate insulating film 61, and is electrically insulated from the semiconductor substrate 10 by the gate insulating film 61. The third gate electrode 60 has, for example, a planar gate structure. The third gate electrode includes, for example, at least one material selected from the group consisting of aluminum (Al), titanium (Ti), nickel (Ni), tungsten (W), gold (Au), and polysilicon. The gate insulating film 61 is, for example, a silicon oxide film.

The collector electrode 30 is selectively provided, for example, on the second surface 10B of the semiconductor substrate 10. The collector electrode 30 is electrically connected to the semiconductor substrate 10 at a location that lacks the third gate electrode 60.

The semiconductor device 1 further includes a conductor, which is hereinafter referred to as an emitter plate 70. The emitter plate 70 is disposed inside the trench GT3, which is on the first surface 10T side of the semiconductor substrate 10. The emitter plate 70 includes, for example, conductive polysilicon. The emitter plate 70 is disposed, for example, parallel to the first gate electrode 40 and the second gate electrode 50, and extends in the Y direction. The emitter plate 70 is electrically insulated from the semiconductor substrate 10 by an insulating film 71. The insulating film 71 is, for example, a silicon oxide film.

The semiconductor substrate 10 includes an n-type base layer 11 (first semiconductor layer), a p-type base layer 13 (second semiconductor layer), an n-type emitter layer 15 (third semiconductor layer), a p-type contact layer 17, an n-type buffer layer 19 (fourth semiconductor layer), a p-type collector layer 21 (fifth semiconductor layer), and an n-type collector layer 23 (sixth semiconductor layer).

The n-type base layer 11 contains, for example, n-type impurities in a concentration range of $1 \times 10^{12}$ to $1 \times 10^{15}$ (atoms/cm$^3$). The n-type base layer 11 has an n-type carrier concentration capable of providing a predetermined breakdown voltage. Here, the n-type carrier concentration is, for example, a value obtained by subtracting p-type impurity concentration from n-type impurity concentration. For example, the n-type silicon wafer for making the n-type base layer 11 contains p-type impurities at a background level. The n-type base layer 11 has, for example, a thickness in the Z direction in the range of 1 to 1000 μm and is set to a thickness capable of providing a predetermined breakdown voltage.

The p-type base layer 13 more specifically is between the n-type base layer 11 and the emitter electrode 20. The p-type base layer 13 is electrically connected to the emitter electrode 20. The p-type base layer 13 has, for example, a p-type impurity in the concentration range of $1 \times 10^{12}$ to $1 \times 10^{14}$ cm$^{-2}$, and has a thickness in the Z direction of 0.1 to several μm. The p-type base layer 13 is formed by, for example, ion implantation of the p-type impurities on the first surface 10T side of the semiconductor substrate 10. The total amount of the p-type impurities is set, for example, in a range of $1 \times 10^{12}$ to $1 \times 10^{14}$ cm$^{-2}$.

The p-type base layer 13 includes, for example, a first part 13m positioned between the first gate electrode 40 and the emitter plate 70, and a second part 13n positioned between the second gate electrode 50 and the emitter plate 70.

The n-type emitter layer 15 is between the p-type base layer 13 and the emitter electrode 20. The n-type emitter layer 15 contains n-type impurities having a higher concentration than the n-type impurities of the n-type base layer 11. The emitter electrode 20 is, for example, in contact with and electrically connected to the n-type emitter layer 15.

The n-type emitter layer 15 has an n-type impurity amount in the range of $1 \times 10^{14}$ to $1 \times 10^{16}$ cm$^{-2}$, for example, and has a thickness in the Z direction of 0.1 to several μm. The n-type emitter layer 15 is formed, for example, by selectively ion implanting an n-type impurity on the first surface 10T side of the semiconductor substrate 10. The total amount of the n-type impurities is set, for example, in the range of $1 \times 10^{14}$ to $1 \times 10^{16}$ cm$^{-2}$.

The p-type contact layer 17 is between the p-type base layer 13 and the emitter electrode 20. The p-type contact layer 17 includes p-type impurities having a higher concentration than the p-type impurities of the p-type base layer 13. The emitter electrode 20 is, for example, in contact with and electrically connected to the p-type contact layer 17. The p-type base layer 13 is electrically connected to the emitter electrode 20 via the p-type contact layer 17.

The p-type contact layer 17 has a p-type impurity amount in the range of $1 \times 10^{14}$ to $1 \times 10^{16}$ cm$^{-2}$, for example, and has a thickness in the Z direction in the range of 0.1 to several μm. The p-type contact layer 17 is formed, for example, by selectively ion implanting p-type impurities on the first surface 10T side of the semiconductor substrate 10. The total amount of the p-type impurities is set, for example, in a range of $1 \times 10^{14}$ to $1 \times 10^{16}$ cm$^{-2}$.

The n-type emitter layer 15 and the p-type contact layer 17 are alternately arranged in a longitudinal direction (for example, the Y direction) of the trenches GT1 to GT3. In addition, an area ratio of a surface of the n-type emitter layer 15 to a surface of the p-type contact layer 17 exposed on the first surface 10T of the semiconductor substrate 10 may be freely changed according to a desired design.

The trenches GT1 to GT3 have a depth reaching the n-type base layer 11 through the n-type emitter layer 15 (or the p-type contact layer 17) and the p-type base layer 13 from the first surface 10T of the semiconductor substrate 10. The trenches GT1 to GT3 are provided periodically in a direction (for example, X direction) along the first surface 10T of the semiconductor substrate 10. The depth of each of the trenches GT1 to GT3 is set, for example, in a range of 1 to 10 μm. An interval between the trench GT1 and the trench GT3 adjacent to each other in the X direction and an interval between the trench GT2 and the trench GT3 are set, for example, in a range of 0.1 to several μm.

In an embodiment, the n-type base layer 11, the p-type base layer 13, and the n-type emitter layer 15 are exposed on the side surfaces of the trench GT1 and the trench GT2. The first gate electrode 40 faces the first part 13$m$ of the p-type base layer 13 positioned between the n-type base layer 11 and the n-type emitter layer 15 via the gate insulating film 41 inside the trench GT1. The second gate electrode 50 faces the second part 13$n$ of the p-type base layer 13 positioned between the n-type base layer 11 and the n-type emitter layer 15 via the gate insulating film 51.

Further, for example, the n-type base layer 11, the p-type base layer 13, and the p-type contact layer 17 are exposed on the side surface of the trench GT3. The emitter plate 70 faces the first part 13$m$ and the second part 13$n$ of the p-type base layer 13 positioned between the n-type base layer 11 and the p-type contact layer 17 via the insulating film 71.

In an embodiment, a plurality of the trench gate structures are provided along the first surface 10T of the semiconductor substrate 10, and are arranged periodically. The interval between the trench gate structures is set, for example, in the range of 0.1 to several μm.

The n-type buffer layer 19 is provided between the n-type base layer 11 and the collector electrode 30. The n-type buffer layer 19 includes a part positioned between the n-type base layer 11 and the third gate electrode 60. The n-type buffer layer 19 contains n-type impurities having a higher concentration than the n-type impurities of the n-type base layer 11. The n-type buffer layer 19 has an n-type impurity amount in the range of $1\times10^{11}$ to $1\times10^{13}$ cm$^{-2}$, for example, and has a thickness in the Z direction in the range of 0.1 to several tens of μm. The n-type buffer layer 19 is formed by, for example, ion implantation of n-type impurities on the second surface 10B side of the semiconductor substrate 10. The total amount of the n-type impurities is set, for example, in the range of $1\times10^{11}$ to $1\times10^{13}$ cm$^{-2}$.

The p-type collector layer 21 is provided between the n-type buffer layer 19 and the collector electrode 30. The p-type collector layer 21 is provided with a p-type impurity amount in the range of $1\times10^{13}$ to $1\times10^{15}$ cm$^{-2}$, for example, and has a thickness in the Z direction in the range of 0.1 to 10 μm. In addition, the p-type collector layer 21 includes a part positioned between the n-type buffer layer 19 and the third gate electrode 60.

The p-type collector layer 21 is formed, for example, by selectively ion implanting p-type impurity on the second surface 10B side of the semiconductor substrate 10. The total amount of the p-type impurities is set in the range of $1\times10^{13}$ to $1\times10^{15}$ cm$^{-2}$, in an embodiment. The implantation energy at the time of forming the p-type collector layer 21 is set lower than the implantation energy at the time of forming the n-type buffer layer 19, in an embodiment. Therefore from these conditions, an implantation depth of the p-type impurities is shallower than an implantation depth of the n-type impurities of the n-type buffer layer 19.

The n-type collector layer 23 is selectively provided on the surface side of the p-type collector layer 21 exposed on the second surface 10B of the semiconductor substrate 10. The n-type collector layer 23 includes, for example, a part positioned between the p-type collector layer 21 and the collector electrode 30. The n-type collector layer 23 includes a part positioned between the p-type collector layer 21 and the third gate electrode 60.

The n-type collector layer 23 includes n-type impurities of higher concentration than the n-type impurities of the n-type base layer 11. The n-type collector layer 23 contains n-type impurities of higher concentration than the n-type impurities of the n-type buffer layer 19. The n-type collector layer 23 has, for example, an n-type impurity amount in the range of $1\times10^{14}$ to $1\times10^{16}$ cm$^{-2}$, and has a thickness in the Z direction of 0.1 to several μm.

The n-type collector layer 23 is formed, for example, by selectively ion implanting n-type impurities on the second surface 10B side of the semiconductor substrate 10. The total amount of the n-type impurities is set, for example, in the range of $1\times10^{14}$ to $1\times10^{16}$ cm$^{-2}$. The implantation energy at the time of forming the n-type collector layer 23 is set, for example, lower than the implantation energy at the time of forming the p-type collector layer 21. Therefore, the implantation depth of the n-type impurities is shallower than the implantation depth of the p-type impurities of the p-type collector layer 21.

The collector electrode 30 is in contact with and electrically connected to a part of the surface of the p-type collector layer 21 exposed on the second surface 10B of the semiconductor substrate 10. In addition, the collector electrode 30 is in contact with and electrically connected to a part of the surface of the n-type collector layer 23 exposed on the second surface 10B of the semiconductor substrate 10.

The third gate electrode 60 faces the p-type collector layer 21 positioned between the n-type buffer layer 19 and the n-type collector layer 23 via the gate insulating film 61. The third gate electrode 60 is electrically insulated from the n-type buffer layer 19 and the n-type collector layer 23 via the gate insulating film 61.

Figure 2A:
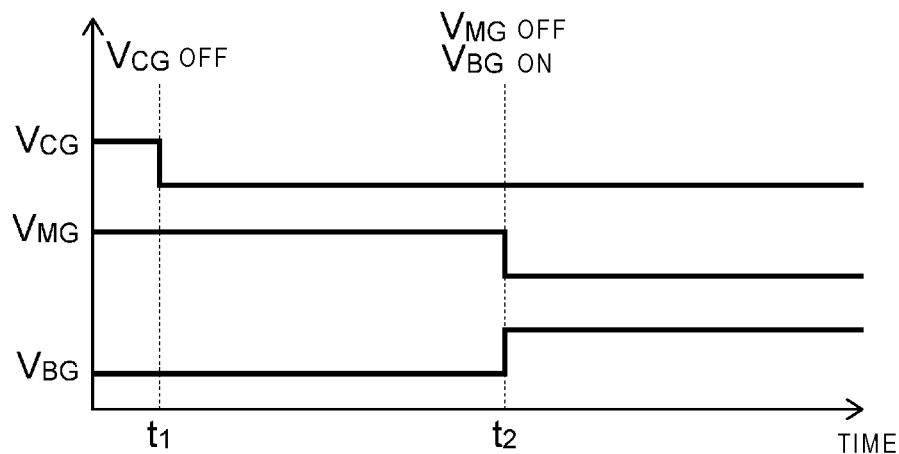
FIGS. 2A to 2C are time charts showing an operation of the semiconductor device according to the first embodiment.
Figure 2B:
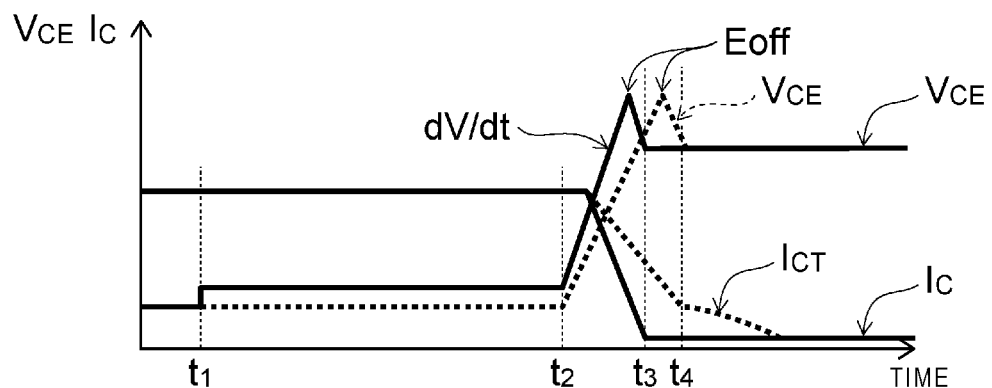
Figure 2C:
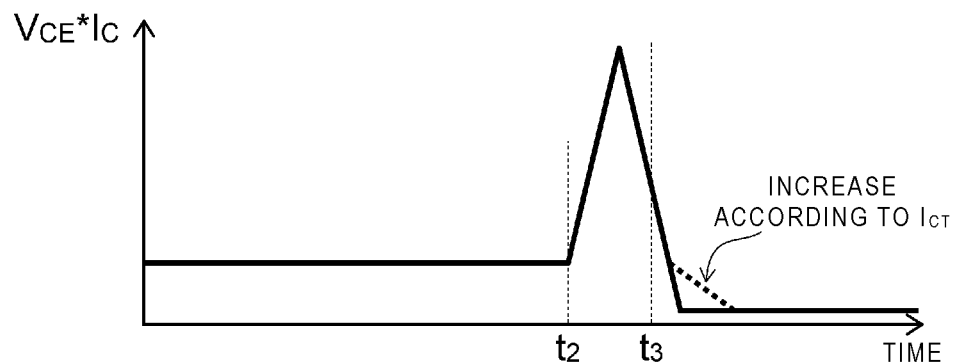
Figure 3A:
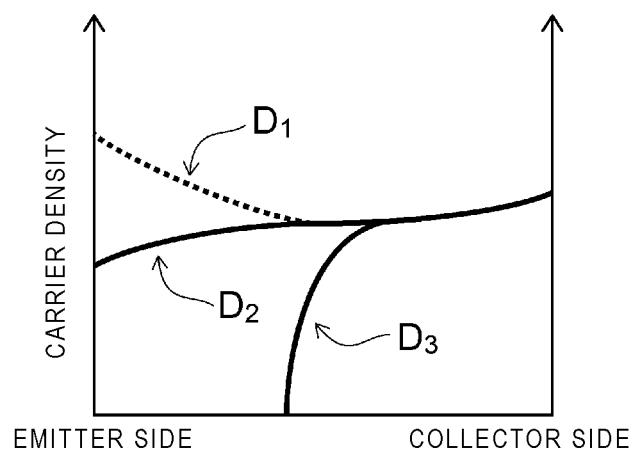
FIGS. 3A and 3B are schematic views showing the operation of the semiconductor device according to the first embodiment.
Figure 3B:
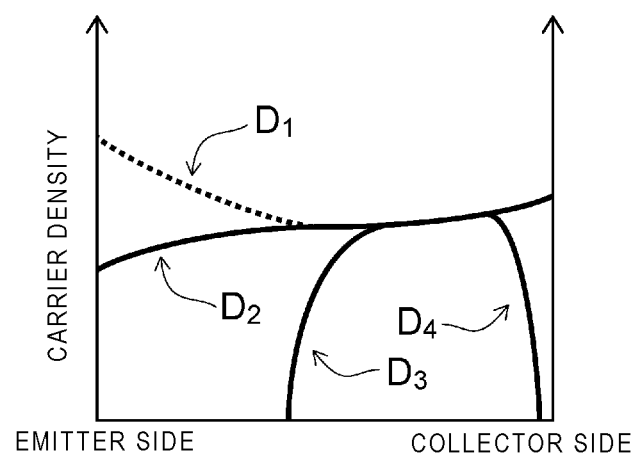

Next, the operation of the semiconductor device 1 according to the embodiment will be described with reference to FIG. 1, FIGS. 2A to 2C, and FIGS. 3A and 3B. FIGS. 2A to 2C are time charts showing the operation of the semiconductor device 1 according to the first embodiment. FIGS. 2A to 2C show a process of turning off the semiconductor device 1. FIGS. 3A and 3B are schematic views showing the operation of the semiconductor device 1. A carrier density distribution in the n-type base layer 11 is shown in FIGS. 3A and 3B.

FIG. 2A is a time chart showing a temporal change of a gate voltage $V_{MG}$ applied to the first gate electrode 40, a gate voltage $V_{CG}$ applied to the second gate electrode 50, and a gate voltage $V_{BG}$ applied to the third gate electrode 60. Here, the gate voltage $V_{MG}$ is a potential difference between the emitter electrode 20 (or the p-type base layer 13) and the first gate electrode 40, and the gate voltage $V_{CG}$ is a potential difference between the emitter electrode (or the p-type base layer 13) and the second gate electrode 50. The gate voltage $V_{BG}$ is a potential difference between the collector electrode 30 (or the p-type collector layer 21) and the third gate electrode 60.

For example, when the semiconductor device 1 is turned on, the gate voltages $V_{MG}$ and $V_{CG}$ which exceed a threshold value are applied to the first gate electrode 40 and the second gate electrode 50. The third gate electrode 60 is held at the gate voltage $V_{BG}$ which does not exceed the threshold value. Hereinafter, application of a gate voltage exceeding the threshold to each gate electrode is expressed as TURN ON, and application of a gate voltage of each gate electrode to a voltage lower than the threshold is expressed as TURN OFF.

By applying the gate voltage $V_{MG}$ and the gate voltage $V_{CG}$, which are higher than the threshold voltage of the first gate electrode 40 and the threshold voltage of the second gate electrode 50, respectively, an n-type channel is formed at an interface between the p-type base layer 13 and the gate insulating film 41 and an interface between the p-type base layer 13 and the gate insulating film 51. Accordingly, the n-type base layer 11 and the n-type emitter layer 15 are electrically connected.

Further, in a part of the first gate electrode 40 and the second gate electrode 50 positioned in the n-type base layer 11, an n-type accumulation layer is formed at an interface between the n-type base layer 11 and the gate insulating film 41 and an interface between the n-type base layer 11 and the gate insulating film 51. Due to the influence of the n-type accumulation layer, accumulation of carriers is promoted in the region of the n-type base layer 11 positioned between the gate electrodes and the emitter plate 70, and the on resistance in the turn-on state can be further reduced. The emitter plate 70 is disposed between the first gate electrode 40 and the second gate electrode 50 so as to promote the accumulation of carriers in these regions, but may also have a structure in which the emitter plate 70 is not provided.

Next, as shown in FIG. 2A, the semiconductor device 1 is turned off by turning off the first gate electrode 40 and the second gate electrode 50. For example, the second gate electrode 50 is turned off at time $t_1$. The first gate electrode is turned off at time t2 after time $t_1$.

When the gate voltage $V_{CG}$ is lowered to the threshold value or less at time $t_1$, the n-type accumulation layer at the interface between the n-type base layer 11 and the gate insulating film 51 disappears. In addition, since the n-type channel induced at the interface between the p-type base layer 13 and the gate insulating film 51 also disappears, an electric conduction between the n-type emitter layer 15 and the n-type base layer 11 is also blocked, and the supply of electrons on a second gate electrode 50 side stops. Correspondingly, the amount of holes injected from the p-type collector layer 21 into the n-type base layer 11 via the n-type buffer layer 19 also decreases. Further, depletion starts from a side wall of the second gate electrode 50, and a depletion layer is formed.

FIG. 3A is a schematic view showing a change in the carrier density distribution in this process. Here, the carrier density is the density of carriers containing both electrons and holes. $D_1$ shown in the drawing represents the carrier density distribution in the ON state, and $D_2$ represents the density distribution before the first gate electrode 40 is turned off and after the second gate electrode 50 is turned off.

Next, at time t2, by turning off the first gate electrode 40, the injection of electrons from the n-type emitter layer 15 to the n-type base layer 11 stops, and the semiconductor device 1 enters a turn-off operation. After the first gate electrode 40 is turned off, the carriers in the n-type base layer 11 decrease along with spreading of the depletion layer and the increase of the voltage between the emitter and the collector (hereinafter referred to as collector voltage $V_{CE}$). Therefore, in order to shorten a turn-off time, it is desirable to reduce the carrier density in the n-type base layer 11 before the first gate electrode 40 is turned off.

In this example, since the second gate electrode 50 is turned off before the first gate electrode 40 is turned off, the carrier density on the emitter side among the carriers accumulated in the n-type base layer 11 is reduced ($D_2$). That is, the first gate electrode 40 can be turned off from the state in which the carrier density is reduced compared with the steady state in which both the first gate electrode 40 and the second gate electrode 50 are turned on. Accordingly, the turn-off process of the semiconductor device 1 is completed by discharging fewer carriers.

Further, when the potential of the second gate electrode 50 is lowered to a negative potential, a p-type inversion layer is induced at the interface between the n-type base layer 11 and the gate insulating film 51. Accordingly, it is possible to promote the discharge of holes to the emitter electrode 20 via the p-type base layer 13.

In an embodiment, the carrier density distribution $D_3$ shown in FIG. 3A represents the carrier density distribution in the n-type base layer 11 when the first gate electrode 40 is turned off and a negative potential is applied to the second gate electrode 50. As shown in the carrier density distribution $D_3$, the carrier density on the emitter side in the n-type base layer 11 is further reduced ($D_2 \rightarrow D_3$). As a result, the turn-off time can be further shortened, and the turn-off loss can be further reduced.

FIG. 2B is a time chart showing a time change of the collector voltage $V_{CE}$ and the collector current $I_C$ at the time of turn-off. When the second gate electrode 50 is turned off at time $t_1$, the injection of electrons on the second gate electrode 50 side is stopped. As a result, although the carrier density on the emitter side is reduced as in the carrier density distribution $D_2$ shown in FIG. 3A, the voltage $V_{CE}$ is slightly increased in order to continue to allow a current of the same value to flow due to the influence of an inductance which exists in the circuit.

Subsequently, when the first gate electrode 40 is turned off at time t2, the injection of electrons into the n-type base layer 11 is stopped. The carriers in the n-type base layer 11 are gradually reduced, and the depletion layer spreads in the n-type base layer 11. Corresponding to the above, the collector current $I_C$ decreases, and at the same time, the collector voltage $V_{CE}$ rises. Thereafter, the collector voltage $V_{CE}$ is a constant value having almost the same value as the power supply voltage. At this point, the carriers remaining in the n-type base layer 11 disappear by recombination.

The change in the collector voltage $V_{CE}$ indicated by a broken line in FIG. 2B is an example that lacks the second gate electrode 50. In this case, depletion of the n-type base layer 11 is delayed since the carrier density in the n-type base layer 11 in the ON state is not reduced in advance. That is, the rise of the n-type collector voltage $V_{CE}$ is delayed, for example, and the collector voltage $V_{CE}$ becomes constant at time t4 later than time t3.

As described above, in the semiconductor device 1, by controlling the second gate electrode 50, the carrier density in the n-type base layer 11 in the turn-off process can be reduced. Accordingly, the turn-off time can be shortened, and the switching loss can be reduced. In addition, it is also possible to increase dV/dt by accelerating the rise of the collector voltage $V_{CE}$.

Further, in an embodiment, at time t2, the third gate electrode 60 is turned on (see FIG. 2A). When the third gate electrode 60 is turned on, an n-type channel is formed at an interface between the p-type collector layer 21 and the gate insulating film 61. Accordingly, the n-type buffer layer 19 and the n-type collector layer 23 are electrically connected. Therefore, the n-type base layer 11 is electrically short-circuited to the collector electrode 30 via the n-type buffer layer 19, the n-type channel, and the n-type collector layer 23. Accordingly, the supply of holes from the p-type collector layer 21 to the n-type base layer 11 is partially or entirely prevented.

FIG. 3B is a schematic view showing a change in the carrier density distribution in this process. $D_4$ shown in the view represents the carrier density distribution after the third gate electrode 60 is turned on. When the third gate electrode 60 is turned on, electrons on the collector side are discharged to the collector electrode 30 and decreased in number. Accordingly, the carrier density on the collector side in the n-type base layer 11 is also reduced.

As described above, when the third gate electrode 60 is turned on to enter the turn-off operation at the timing of turning off the first gate electrode 40, the depletion layer also extends from the collector side, and the carriers in the n-type base layer 11 may be eliminated at an earlier time. Accordingly, the turn-off loss may be further reduced.

Furthermore, hole injection from the p-type collector layer 21 can be prevented by turning on the third gate electrode 60. Accordingly, a tail component $I_{CT}$ of the collector current $I_C$, which is indicated by a dotted line in FIG. 2B can be reduced.

FIG. 2C is a time chart showing a time change of the product of the collector voltage $V_{CE}$ and the collector current $I_C$. In other words, this is the power consumption of the semiconductor device 1. As shown in the same drawing, after the first gate electrode 60 is turned off at time t2, the collector current $I_C$ continues to flow while the collector voltage $V_{CE}$ rises, so that the power consumption of the semiconductor device 1 increases. Thereafter, as the collector current $I_C$ decreases, the power consumption also decreases. An integrated value of the power during this period corresponds to the switching loss.

In the semiconductor device 1 according to the embodiment, the time lag from when the first gate electrode 40 is shut off until collector current $V_{CE}$ is shut off can be shortened by controlling the second gate electrode. Accordingly, the switching loss can be reduced. Furthermore, turning on the third gate electrode 60 can reduce the tail component $I_{CT}$ of the collector current $I_C$, which further reduces the switching loss (see FIG. 2C).

As described in the above embodiment, semiconductor device 1 can have reduced switching loss while maintaining the on-resistance. The timing for switching the third gate electrode 60 is not limited to the above embodiment. For example, the third gate electrode may be turned on before the second gate electrode 50 is turned off, the third gate electrode may be turned on before the first gate electrode 40 is turned off, and the third gate electrode 60 may be turned on after the first gate electrode 40 is turned off. Further, the third gate electrode 60 may be returned to the off state after the semiconductor device 1 is turned off or before the collector voltage $V_{CE}$ rises to a predetermined value.

Figure 4:
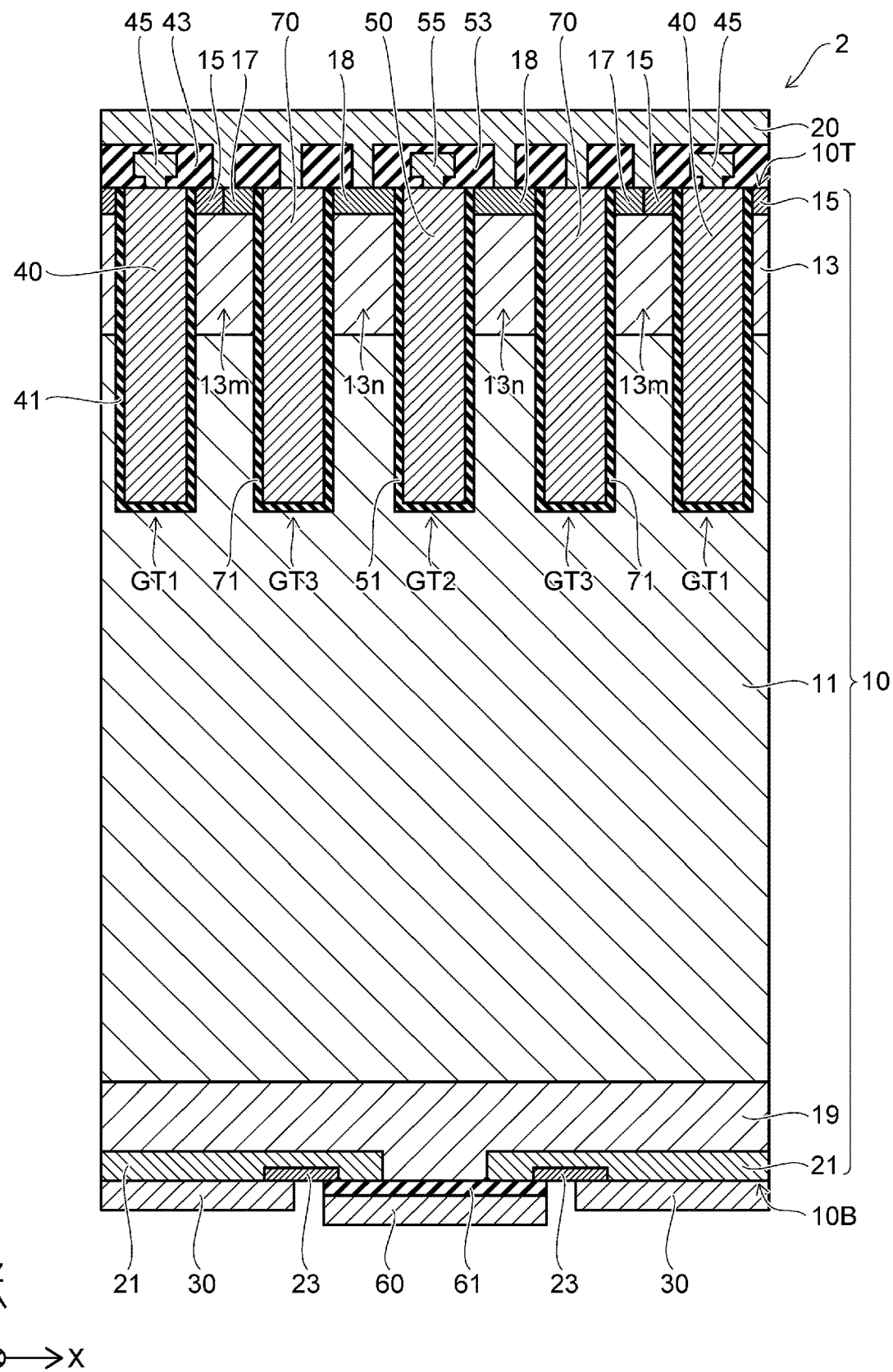
FIG. 4 is a schematic cross-sectional view of a semiconductor device according to a modification of the first embodiment.

FIG. 4 is a schematic cross-sectional view showing a semiconductor device 2 according to a modification of the first embodiment. In the semiconductor device 2 shown in FIG. 4, the semiconductor substrate 10 includes the first part 13m of the p-type base layer 13 positioned between the first gate electrode 40 and the emitter plate 70, and the second part 13n of the p-type base layer 13 positioned between the second gate electrode 50 and the emitter plate 70.

The semiconductor substrate 10 includes a p-type contact layer 18 (seventh semiconductor layer) between a portion of the p-type base layer 13 and the emitter electrode 20. The p-type contact layer 18 includes a higher concentration of p-type impurities than the concentration of p-type impurities of the p-type base layer 13. The emitter electrode 20 is in contact with and electrically connected to the p-type contact layer 18. The second part 13n of the p-type base layer 13 is electrically connected to the emitter electrode 20 via the p-type contact layer 18. In this example, the n-type emitter layer 15 is not provided between the second part 13n of the p-type base layer 13 and the emitter electrode 20.

For example, in the ON state of the semiconductor device 2, the first gate electrode 40 is turned on, and the second gate electrode 50 and the third gate electrode 60 are turned off.

In the process of turning off the semiconductor device 2, for example, the second gate electrode 50 is set to a negative potential before the first gate electrode 40 is turned off. Accordingly, a p-type inversion layer is induced at the interface between the n-type base layer 11 and the gate insulating film 51. Further, a p-type accumulation layer is formed at the interface between a portion of the p-type base layer 13 and the gate insulating film 51. Accordingly, a hole discharge path is formed from the n-type base layer 11 to the emitter electrode 20 via the p-type inversion layer, the p-type accumulation layer, and a p-type contact layer 18.

This promotes discharge of holes from the n-type base layer 11 and can reduce the carrier density in the n-type base layer 11.

Subsequently, the first gate electrode 40 is turned off (see FIG. 2A), the injection of electrons from the emitter electrode 20 is completely stopped, and the semiconductor device 2 begins to turn off. Since the carrier density in the n-type base layer 11 is reduced by applying the negative potential to the second gate electrode 50, the turn-off is completed by discharging fewer carriers. Therefore, compared to operation of a device that lacks the second gate electrode 50, turn-off time can be shortened, and turn-off loss can be reduced.

Further, operation of the third gate electrode 60 prevents hole injection from the p-type collector layer 21 and further reduces turn-off loss. The timing of switching on the third gate electrode 60 may be the same as exemplified in FIG. 2A, or may deviate before and after the time t3 when the first gate electrode 40 is turned off.

Figure 5:
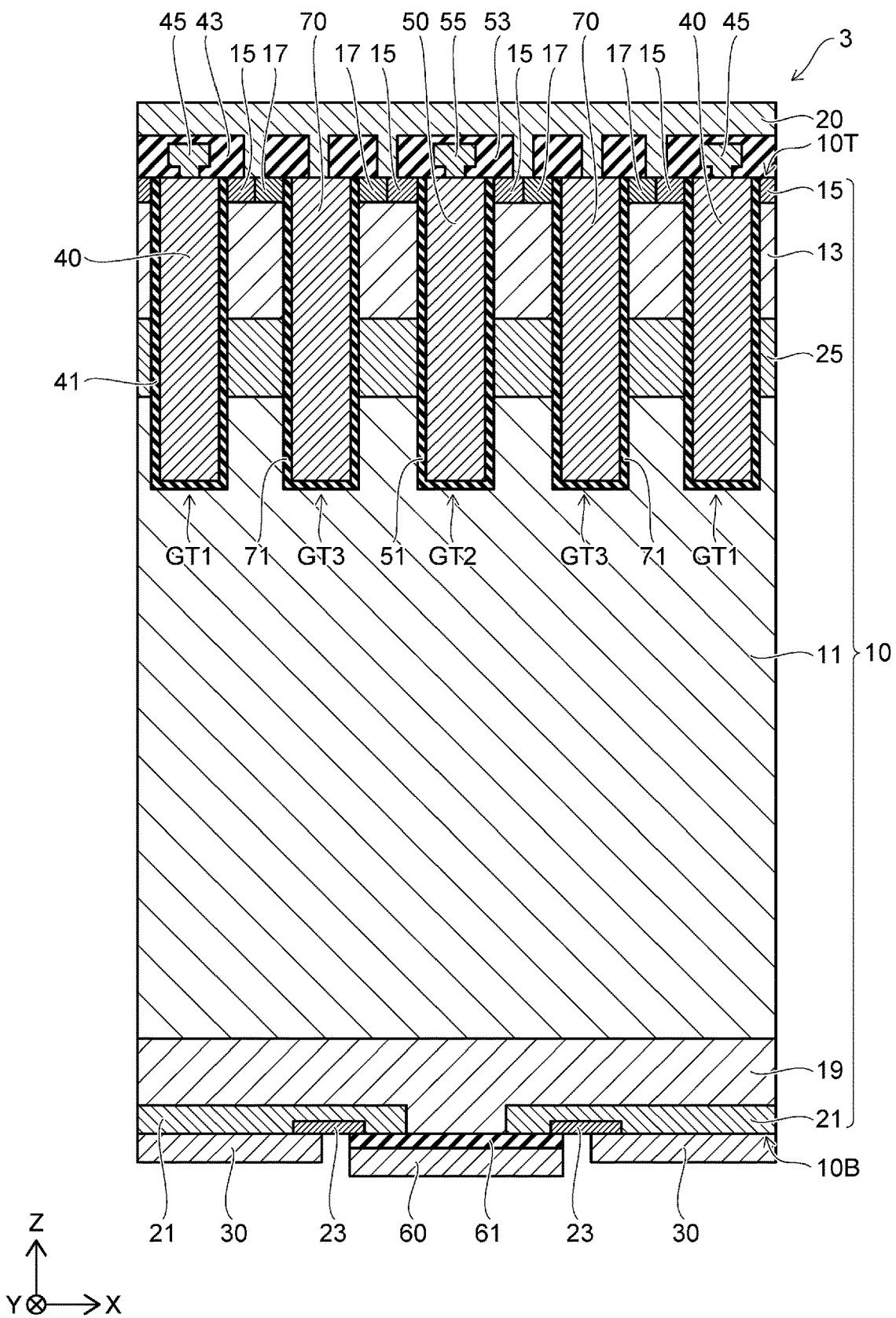
FIG. 5 is a schematic cross-sectional view of a semiconductor device according to another modification of the first embodiment.

FIG. 5 is a schematic cross-sectional view showing a semiconductor device 3 according to another modification of the first embodiment. The semiconductor substrate 10 of the semiconductor device 3 shown in FIG. 5, semiconductor substrate 10 further includes an n-type barrier layer 25 (eighth semiconductor layer) positioned between the n-type base layer 11 and the p-type base layer 13 semiconductor substrate 10.

The n-type barrier layer 25 has a higher concentration of n-type impurities, than that found in the n-type base layer 11. In addition, the concentration of n-type impurities in the n-type barrier layer 25 is lower than that of the n-type emitter layer 15. The n-type barrier layer 25 has an n-type impurity amount in the range of $1\times10^{12}$ to $1\times10^{14}$ $cm^{-2}$, for example, and has a thickness in the Z direction in the range of 0.1 to several μm. The n-type barrier layer 25 is formed by, for example, ion implantation of n-type impurities on the first surface 10T side of the semiconductor substrate 10. The total amount of the n-type impurities is set, for example, in the range of $1\times10^{12}$ to $1\times10^{14}$ $cm^{-2}$.

The second gate electrode 50 and the third gate electrode 60 of the semiconductor device 3 can be controlled to reduce the switching loss while maintaining the on-resistance. Furthermore, the added n-type barrier layer 25 acts to accumulate charge carriers on the emitter side in the n-type base layer 11. The n-type barrier layer enhances the effect of reducing the carrier density by turning off the second gate electrode 50 before turning off the first gate electrode 40.

Second Embodiment

Figure 6:
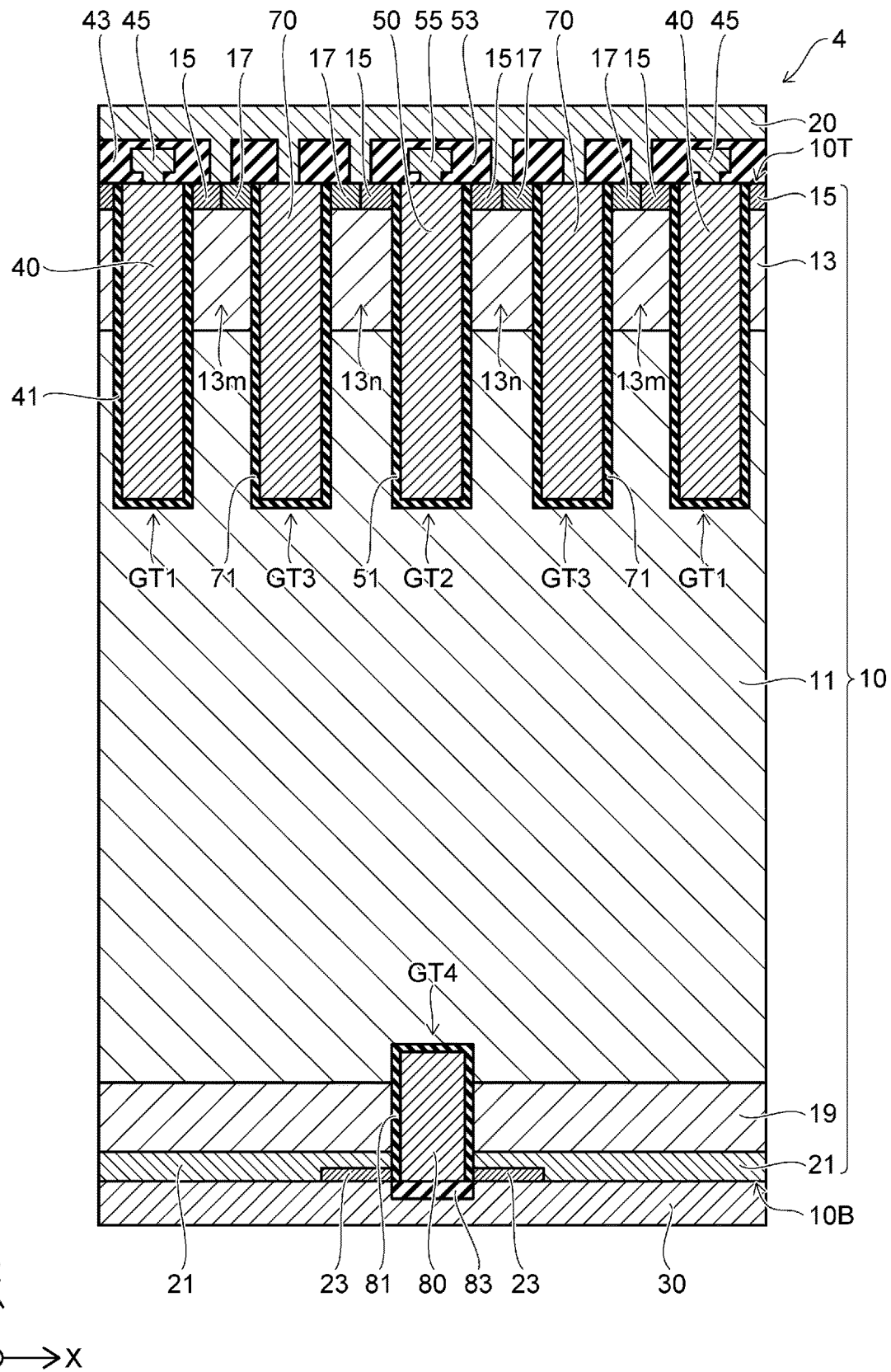
FIG. 6 is a schematic cross-sectional view of a semiconductor device according to a modification of a second embodiment.

FIG. 6 is a schematic sectional view of semiconductor device 4 according to the second embodiment.

The semiconductor device 4 shown in FIG. 6 includes a third gate electrode 80 having a trench gate structure. The third gate electrode 80 is disposed inside the trench GT4 that is on the second surface 10B side of the semiconductor substrate 10. The gate insulating film 81 electrically insulates the third gate electrode 80 from the semiconductor substrate 10.

As shown in FIG. 6, the third gate electrode 80 is between the semiconductor substrate 10 and the collector electrode 30. The third gate electrode is electrically insulated from the collector electrode 30 via the insulating film 83. In addition, the third gate electrode 80 faces the n-type buffer layer 19, the p-type collector layer 21, and the n-type collector layer 23 via the gate insulating film.

The p-type collector layer 21 is provided between the n-type buffer layer 19 and the collector electrode 30. The n-type collector layer 23 is selectively provided between the p-type collector layer 21 and the collector electrode 30.

The second gate electrode 50 and the third gate electrode 80 of the semiconductor device 4 can be controlled to reduce the switching loss while maintaining the on-resistance. Uncommon components described in the above embodiments are not unique to each semiconductor device and may be mutually applied or replaced if technically possible as determined by a skilled artisan.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor substrate including a first semiconductor layer of a first conductivity type, and having a first surface and a second surface on an opposite side of the first surface;
a first electrode on the first surface;
a first control electrode which is provided inwardly from the first surface of the semiconductor substrate, and electrically insulated from the semiconductor substrate via a first insulating film and electrically insulated from the first electrode via a second insulating film;
a second control electrode which is provided inwardly from the first surface of the semiconductor substrate, and electrically insulated from the semiconductor substrate via a third insulating film, electrically insulated from the first electrode via a fourth insulating film, and biased independently from the first control electrode;
a third control electrode on a first portion of the second surface and electrically insulated from the semiconductor substrate via a fifth insulating film; and
a second electrode on a second portion of the second surface and electrically connected to the semiconductor substrate,
wherein the semiconductor substrate includes:
a second semiconductor layer of a second conductivity type between the first semiconductor layer and the first electrode;
a third semiconductor layer of the first conductivity type between the second semiconductor layer and the first electrode;
a fourth semiconductor layer of the first conductivity type between the first semiconductor layer and the second electrode and between the first semiconductor layer and the third control electrode, and having a higher concentration of a first conductivity type impurity than the first semiconductor layer;
a fifth semiconductor layer of the second conductivity type between the fourth semiconductor layer and the second electrode; and
a sixth semiconductor layer of the first conductivity type which is at least partially provided between the fifth semiconductor layer and the second electrode, and
wherein the first control electrode faces a first portion of the second semiconductor layer via the first insulating film,
the second control electrode faces a second portion of the second semiconductor layer via the third insulating film, and
the third control electrode faces a portion of the fifth semiconductor layer via the fifth insulating film.

2. The semiconductor device according to claim 1, wherein each of the first control electrode and the second control electrode is inside a first trench provided inwardly of the first surface of the semiconductor substrate.

3. The semiconductor device according to claim 2 further comprising:
a conductor inside a second trench provided between the first control electrode and the second control electrode, electrically insulated from the semiconductor substrate via a sixth insulating film, and electrically connected to the first electrode, wherein
the conductor faces the first semiconductor layer and the first portion and the second portion of the second semiconductor layer via the sixth insulating film.

4. The semiconductor device according to claim 1, wherein
the semiconductor substrate further includes a seventh semiconductor layer of the second conductivity type between the second semiconductor layer and the first electrode, and
the second control electrode has a surface that faces the second portion of the second semiconductor layer that is between the first semiconductor layer and the seventh semiconductor layer via the third insulating film.

5. The semiconductor device according to claim 1, wherein the semiconductor substrate further includes a seventh semiconductor layer of the second conductivity type that is between the second semiconductor layer and the first electrode, and has a second conductivity type impurity concentration higher than the second semiconductor layer.

6. The semiconductor device according to claim 5, wherein the semiconductor substrate further includes an eighth semiconductor layer of the first conductivity type between the first semiconductor layer and the second semiconductor layer, which has a first conductivity type impurity concentration higher than the first semiconductor layer.

7. The semiconductor device according to claim 1, wherein the fourth semiconductor layer is between the first semiconductor layer and the third control electrode, and the fourth semiconductor layer and the fifth semiconductor layer each include a portion that is exposed on the second surface.

8. The semiconductor device according to claim 1, wherein the third control electrode is inside a trench on the second surface side of the semiconductor substrate.

9. A semiconductor device comprising:
a semiconductor substrate having a first surface and a second surface on an opposite side of the first surface;
an emitter electrode on the first surface;
a first control trench electrode extending into the first surface of the semiconductor substrate, which is electrically insulated from the semiconductor substrate via a first insulating film and electrically insulated from the emitter electrode via a second insulating film;
a second control trench electrode extending into the first surface of the semiconductor substrate, which is electrically insulated from the semiconductor substrate via a third insulating film and electrically isolated from the emitter electrode via a fourth insulating film, and biased independently from the first control trench electrode;
a third control electrode on a first portion of the second surface and electrically insulated from the semiconductor substrate via a fifth insulating film; and
a collector electrode on a second portion of the second surface side and electrically connected to the semiconductor substrate,
wherein the semiconductor substrate includes:
a first semiconductor layer of a first conductivity type,
a second semiconductor layer of a second conductivity type between the first semiconductor layer and the emitter electrode;
a third semiconductor layer of the first conductivity type between the second semiconductor layer and the emitter electrode;
a fourth semiconductor layer of the first conductivity type between the first semiconductor layer and the collector electrode and between the first semiconductor layer and the third control electrode, and having a higher concentration of a first conductivity type impurity than the first semiconductor layer;
a fifth semiconductor layer of a second conductivity type between the fourth semiconductor layer and the collector electrode; and
a sixth semiconductor layer of the first conductivity type which is at least partially provided between the fifth semiconductor layer and the collector electrode.

10. The semiconductor device according to claim 9, wherein
the first control trench electrode faces a first portion of the second semiconductor layer via the first insulating film,
the second control trench electrode faces a second portion of the second semiconductor layer via the third insulating film, and
the third control electrode faces a portion of the fifth semiconductor layer via the fifth insulating film.

11. A semiconductor device comprising:
a semiconductor substrate having a first surface and a second surface on an opposite side of the first surface;
an emitter electrode on the first surface;
a first control trench electrode extending into the first surface of the semiconductor substrate, which is electrically insulated from the semiconductor substrate via a first insulating film and electrically insulated from the emitter electrode via a second insulating film;
a second control trench electrode extending into the first surface of the semiconductor substrate, which is electrically insulated from the semiconductor substrate via a third insulating film and electrically isolated from the emitter electrode via a fourth insulating film, and biased independently from the first control trench electrode;
a third control electrode on a first portion of the second surface and electrically insulated from the semiconductor substrate via a fifth insulating film, the third control electrode being in a trench; and
a collector electrode on a second portion of the second surface side and electrically connected to the semiconductor substrate,
wherein the semiconductor substrate includes:
a first semiconductor layer of a first conductivity type,
a second semiconductor layer of a second conductivity type between the first semiconductor layer and the emitter electrode;
a third semiconductor layer of the first conductivity type between the second semiconductor layer and the emitter electrode;
a fourth semiconductor layer of the first conductivity type between the first semiconductor layer and the collector electrode and between the first semiconductor layer and the third control electrode, and having a higher concentration of a first conductivity type impurity than the first semiconductor layer;
a fifth semiconductor layer of a second conductivity type between the fourth semiconductor layer and the collector electrode; and
a sixth semiconductor layer of the first conductivity type which is at least partially provided between the fifth semiconductor layer and the collector electrode.

12. The semiconductor device according to claim 11, wherein
the first control trench electrode faces a first portion of the second semiconductor layer via the first insulating film,
the second control trench electrode faces a second portion of the second semiconductor layer via the third insulating film, and
the third control electrode faces a portion of the fifth semiconductor layer via the fifth insulating film.

* * * * *

UNITED STATES PATENT AND TRADEMARK OFFICE
CERTIFICATE OF CORRECTION

PATENT NO. : 10,985,268 B2  
APPLICATION NO. : 16/558237  
DATED : April 20, 2021  
INVENTOR(S) : Tomoko Matsudai et al.

Page 1 of 1

It is certified that error appears in the above-identified patent and that said Letters Patent is hereby corrected as shown below:

On the Title Page

Item (72), Lines 1-2, Inventors:  
Please delete Tomoko Matsudai's residence "Tokyo (JP)" and replace with --Shibuya Tokyo (JP)--.  
Please delete Yoko Iwakaji's residence "Tokyo (JP)" and replace with --Meguro Tokyo (JP)--.

Item (73) Assignees:  
Please delete the 1st Assignee's information "KABUSH1 KI KAISHA TOSHIBA, Tokyo (JP)" and replace with --KABUSHIKI KAISHA TOSHIBA, Tokyo (JP)--.

Signed and Sealed this  
Twenty-third Day of November, 2021

Drew Hirshfeld  
*Performing the Functions and Duties of the*  
*Under Secretary of Commerce for Intellectual Property and*  
*Director of the United States Patent and Trademark Office*